United States Patent [19]

Nagaraj

[11] Patent Number: 5,633,601

[45] Date of Patent: May 27, 1997

[54] FIELD PROGRAMMABLE GATE ARRAY LOGIC MODULE CONFIGURABLE AS COMBINATIONAL OR SEQUENTIAL CIRCUITS

[75] Inventor: N. S. Nagaraj, Karntaka, India

[73] Assignee: Texas Instruments Incorporated, Dallas, Tex.

[21] Appl. No.: 401,835

[22] Filed: Mar. 10, 1995

[51] Int. Cl.$^6$ ............................................. H03K 19/177
[52] U.S. Cl. ............................................. 326/38; 326/39
[58] Field of Search ........................... 326/37–41, 47

[56] References Cited

U.S. PATENT DOCUMENTS

| | | | |
|---|---|---|---|
| 4,642,487 | 2/1987 | Carter | 326/41 |
| 4,918,641 | 4/1990 | Jigour et al. | 326/40 |
| 5,122,685 | 6/1992 | Chan et al. | 326/41 |
| 5,258,668 | 11/1993 | Cliff et al. | 326/41 |
| 5,386,154 | 1/1995 | Goetting et al. | 326/38 |
| 5,451,887 | 9/1995 | El Ayat et al. | 329/39 |

*Primary Examiner*—Edward P. Westin
*Assistant Examiner*—Jon Santamauro
*Attorney, Agent, or Firm*—Gerald E. Laws; C. Alan McClure; James C. Kesterson

[57] ABSTRACT

A logic module 400 for use in a field programmable gate array 100 can be selectively reconfigured to perform over 1800 Boolean combinational functions on each output 431–432, to operate as a full adder with sum and carry outputs, or to form the sequential function of a D-latch or a D-flipflop. The logic module has ten input terminals 411–418, 421–422 and two output terminals 431–432. The logic module is comprised of two-input multiplexors 500 and 600 which are used to form both the combinational and sequential circuits, thereby efficiently utilizing space on gate array 100. The D-latch and D-flipflop have a preset input terminal 415 and a clear input terminal 414. Furthermore, the D-latch can be configured to be latched on either a low level or a high level clock signal on terminal 411, while the D-flipflop can be configured to be triggered by either a low to high transition or a high to low transition of a clock signal on terminal 411. A logic module 401 can be configured to provide both a Q and !Q outputs of the D-latch or D-flipflop on output terminals 431–432. A logic module 402 can be configured to additionally provide a circuit of two D-latches.

19 Claims, 10 Drawing Sheets

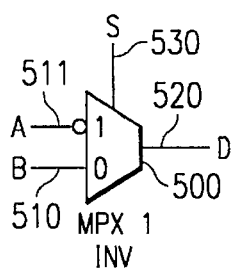
FIG. 5A
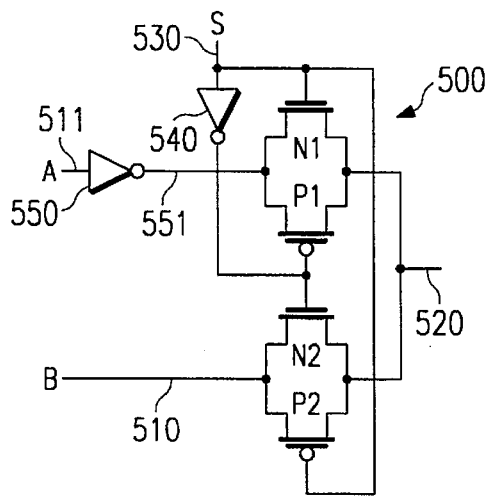
FIG. 5B
FIG. 5C
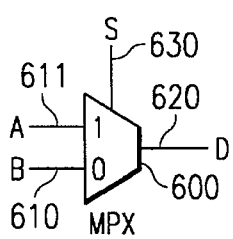
FIG. 6A
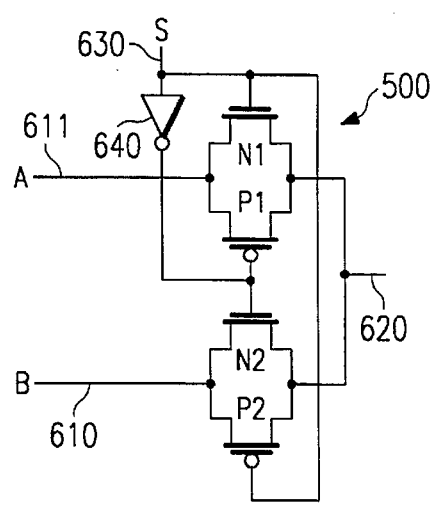
FIG. 6B
FIG. 6C

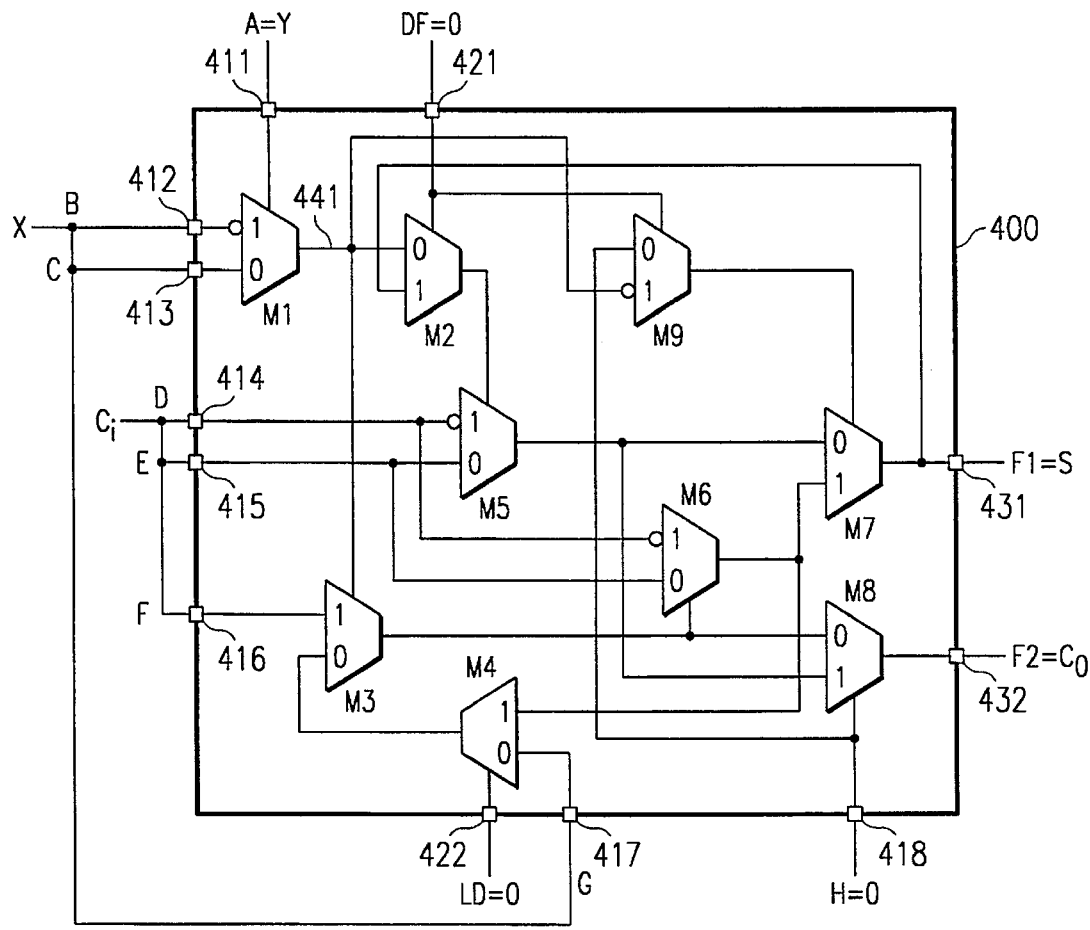
FIG. 8A
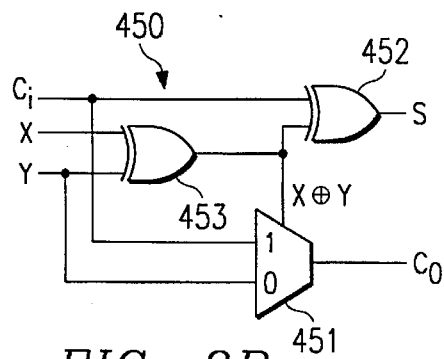
FIG. 8B
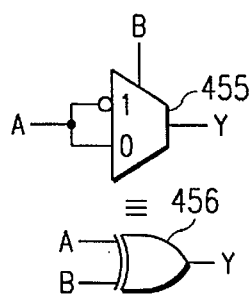
FIG. 8D
| X | Y | $C_i$ | $X \oplus Y$ | S | $C_0$ |
|---|---|---|---|---|---|
| 0 | 0 | 0 | 0 | 0 | 0 |
| 0 | 0 | 1 | 0 | 1 | 0 |
| 1 | 1 | 0 | 0 | 0 | 1 |
| 1 | 1 | 1 | 0 | 1 | 1 |
| 0 | 1 | 0 | 1 | 1 | 0 |
| 0 | 1 | 1 | 1 | 0 | 1 |
| 1 | 0 | 0 | 1 | 1 | 0 |
| 1 | 0 | 1 | 1 | 0 | 1 |
FIG. 8C

FIELD PROGRAMMABLE GATE ARRAY LOGIC MODULE CONFIGURABLE AS COMBINATIONAL OR SEQUENTIAL CIRCUITS

FIELD OF THE INVENTION

The present invention relates to electronic circuits and, more specifically, to field programmable gate array (FPGA) logic modules that achieve improved performance and silicon area efficiency characteristics and methods for forming such a module.

BACKGROUND OF THE INVENTION

Field programmable gate arrays (FPGA) are integrated circuits that may be configured, or programmed, by the user to form complex logic circuits. Programming is performed after the FPGA is manufactured, generally at the site of the purchaser, or "in the field." FPGA's provide many of the advantages of custom integrated circuits, such as complex functions in a single package, low power consumption, etc. Small quantities of such circuits can be created using FPGA's much less expensively than a custom integrated circuit. FPGAs combine the flexibility of mask programmable gate arrays with the convenience of field programmability.

FPGA's have two primary elements: (1) a two dimensional array of universal logic modules and (2) a corresponding array of programmable interconnects to form the selective programmable connections between the logic modules. The universal logic modules are made up of a number of functional devices such as diodes, transistors, logic gates, multiplexers, and the like. The logic modules are interconnected by selectively programming the programmable interconnects to establish connections between the outputs of one logic module and the inputs of other logic modules. The programmable interconnects may be fuses, antifuses, or other means. Signals generated external to the FPGA are also connected by programmable interconnects to the inputs of various logic modules. Output signals from selected logic modules may be connected by programmable interconnects to outputs of the FPGA. The output of each logic module is a logical combination of the inputs of that logic module and may correspond to, for example, digital logic devices such as NAND gates, AND gates, and OR gates. A typical logic module will have approximately eight inputs and can be connected so that any one of several hundred boolean combinations of one to eight input signals is produced at the output.

Prior art FIG. 1 shows a portion of a typical FPGA 100. Six logic modules 101 are shown, arranged in two rows of three. The array size of a typical FPGA may be 12 by 40, for example, or larger. Each logic module 101 has a plurality of inputs, such as inputs 102a–102h and an output, such as output 104. An interconnect network comprising vertical tracks and horizontal tracks may be selectively configured by programming fuses or antifuses, as described in U.S. Pat. No. 5,166,557 Gate Array with Built-in Programming Circuitry, to interconnect the logic modules. The horizontal tracks are typically broken into smaller segments to allow flexibility in establishing the selected connections.

Still referring to prior art FIG. 1, a plurality of external input signals may be connected to a plurality of external pins, such as pin 116, buffered by receivers, such as receiver 118, and placed on horizontal track segments, such as segment 112a. Horizontal segment 112a may be connected to horizontal segment 114a by programming antifuse 108 to be conductive. Other horizontal segments may be similarly interconnected. One of a plurality of horizontal track segments 112a–112d may be selectively connected to the logic module inputs, such as input 102a, by programming one of antifuses 106a–106d to be conductive. Each logic module 101 has an output, such as output 104, connected to a vertical track, such as track 110. Output 104 may be connected to a plurality of horizontal segments, such as segments 112a–112dand segments 124a–124d, by programming any of antifuses 107a–107dand 109a–109d, respectively, to be conductive. A plurality of output drivers, such as driver 122, connect to a plurality of output pins, such as pin 120, to drive a plurality of external signals.

Prior art FIG. 2 shows FPGA logic module 101 comprising multiplexers 210, 212, 214, AND gate 216 and NOR gate 218. Various combinational results of signals placed on input terminals 102a–102hcan be formed and placed on output terminal 104, for example: 102e AND 102f, 102e AND 102f AND 102d, 102g NOR 102h, etc, as is well understood to those skilled in the art. Typically, approximately several hundred logical combinations of input terminals 102a–102h can be formed.

Prior art FIG. 3 shows an FPGA logic module 300 which is comprised of logic module 101, of the type illustrated in FIG. 2, connected to logic module 302. Logic module 302 typically provides a latch and/or flipflop function which allows the signal leaving module 101 to be either latched or passed through without being latched. Control signals 304a and 304b control what function module 302 performs. The end result is that logic module 300 can be reconfigured to perform various combinational logic functions or a sequential latch function.

When a FPGA of the type illustrated in FIG. 3 is used to implement a complex logic circuit, portions of the logic circuit typically require combinational logic functions, while other portions of the logic circuit typically require sequential logic functions. However, if logic module 300 is used as a combinational logic function, then module 302 may be essentially unused. Likewise, if logic module 300 is used as a sequential latch function, then logic module 101 may not always be used. Space on the FPGA may be wasted since large amounts of logic modules may not be usable in any given application. Furthermore, several logic modules 300 may be needed to create commonly used logic functions, such as an adder, thereby undesirably reducing the maximum size of a logic circuit that can be created on a single FPGA 100 by the user.

Accordingly, it is an object of the invention to create a logic module that uses less space so that more logic modules can be placed in a given FPGA.

Another object of the invention is to create a logic module that is capable of performing more logic functions than prior art modules.

Other objects and advantages will be apparent to those of ordinary skill in the art having reference to the following figures and specification.

SUMMARY OF THE INVENTION

In accordance with the present invention, a logic module for use in a field programmable gate array is provided that can be selectively reconfigured to perform over 1800 boolean combinational functions on each output, to operate as a full adder with sum and carry outputs, or to perform the sequential function of a D-latch or a D-flipflop. The logic module has ten input terminals and two output terminals.

Another aspect of the present invention is that the D-latch and D-flipflop functions advantageously have preset and clear inputs. Furthermore, the D-latch can be advantageously configured to be latched on either a low level or a high level clock input, while the D-flipflop can be configured to be triggered by either a low to high transition or a high to low transition of a clock input.

Another feature of the present invention is that a logic module can be configured to provide both the Q and Q /outputs of the D-latch or D-flipflop on the output terminals.

Another aspect of the current invention is that a logic module can be configured to additionally provide the function of two D-latches.

Another aspect of the current invention is the efficiency of space utilization. The logic module is comprised entirely of two input multiplexers which advantageously may be used to perform both the combinational and sequential functions.

BRIEF DESCRIPTION OF THE DRAWINGS

Other features and advantages of the present invention will become apparent by reference to the following detailed description when considered in conjunction with the accompanying drawings; in which:

FIGS. 5A–5C illustrate the construction and function of the inverting input multiplexers used in FIG. 4, FIGS. 6A–6C illustrate the construction and function of the non-inverting multiplexers used in FIG. 4, FIGS. 7A–7B illustrate the logic module of FIG. 4 configured as a pure combinational block, FIGS. 8A–8E illustrate the logic module of FIG. 4 configured as a full adder circuit.

Corresponding numerals and symbols in the different figures and tables refer to corresponding parts unless otherwise indicated.

DETAILED DESCRIPTION OF THE INVENTION

Figure 1:
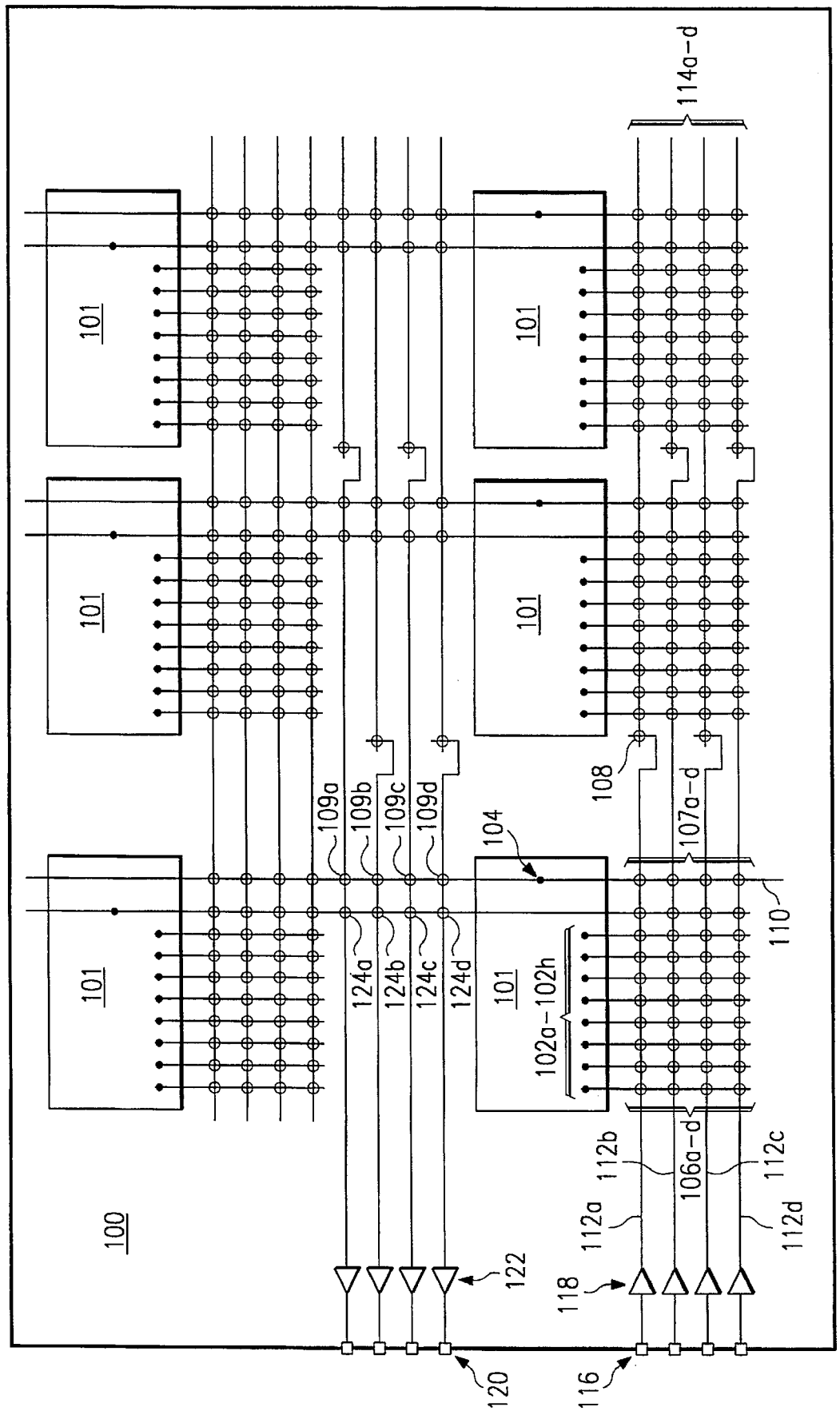
FIG. 1 is a prior art FPGA illustrating logic modules and an interconnection network.
Figure 2:
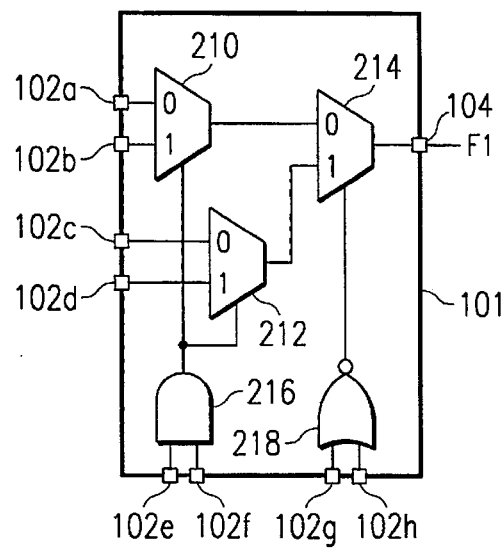
FIG. 2 is a prior art logic module illustrating the logic elements within the logic modules of FIG. 1.
Figure 3:
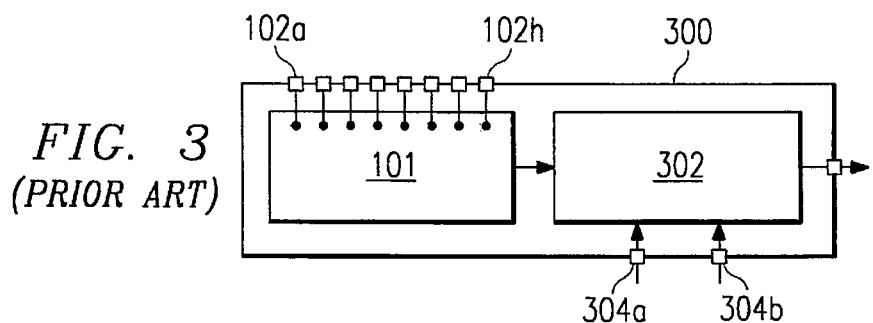
FIG. 3 is a prior art logic module illustrating an alternate logic module of FIG. 1 having both a combinational part and a separate sequential part.

Prior art FIG. 1 illustrates a portion of a field programmable gate array 100, hereinafter referred to as a "FPGA," which contains multiple logic modules 101 and an interconnection network. Logic module 101 is illustrated in prior art FIG. 2. The interconnect network is comprised of vertical and horizontal tracks, such as vertical track 110, horizontal track segments 112a–112d and 114a–114d. The interconnect network can be programmed to selectively interconnect the output terminal 104 of one module 101 with the input terminals 102a–102h of various other logic modules 101. Programming is performed by causing antifuses, such as antifuses 106a–106d, 107a–107d and 108, to become conductive in response to a voltage pulse that programs each selected antifuse, as is well know by those skilled in the art. The present invention is a new logic module that can be used in FPGAs, such as FPGA 100, to advantageously increase the functionality of FPGA 100. Functionality is increased by advantageously increasing the number of functions that can be performed by each logic module in order to advantageously reduce the chip area utilized to form the circuits to perform many desirable complex digital logic functions, as compared to the chip area utilized by prior art FPGAs.

Figure 4:
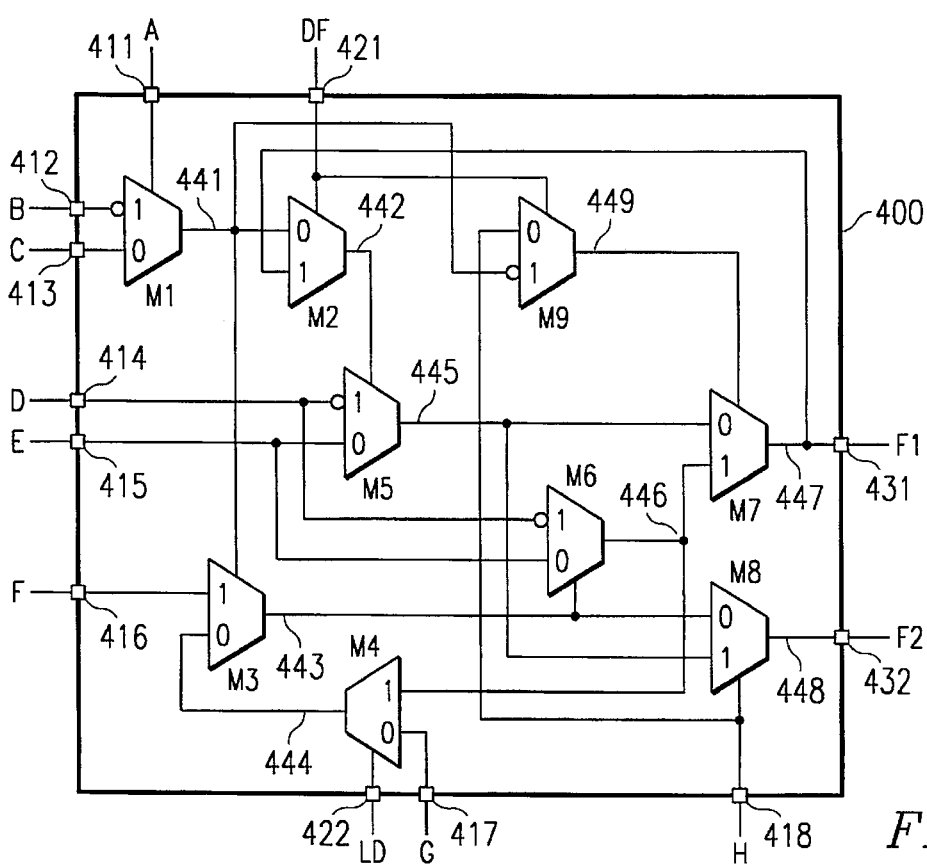
FIG. 4 shows a logic module formed in accordance with the present invention.

FIG. 4 shows a logic module 400 formed in accordance with the present invention. Logic module 400 comprises a plurality of interconnected logic elements M1–M9. Each logic element M1–M9 is a two input multiplexer, hereinafter referred to as a "mux." Muxes M1, M5, M6 and M9 have one inverting input; the rest have two noninverting inputs. A plurality of input terminals 411–418 and 421–422 receive data and control signals that are generated external to logic module 400. Two output terminals 431–432 provide output signals for use external to logic module 400.

FIGS. 5A–5C illustrate a two input mux 500 which is representative of the muxes having one inverting input shown in FIG 4. FIG. 5A shows 0-input 510, inverting 1-input 511, select control 530, and output 520. FIG. 5B shows the digital logic truth table for mux 500. FIG. 5C shows the construction of mux 500. Transistors N1–N2 are NMOS transistors and transistors P1–P2 are PMOS transistors. Select control 530 connects to inverter 540, the gate of transistor N1 and the gate of transistor P2. The output of inverter 540 connects to the gates of transistors P1 and N2. Inverter 550 inverts a signal connected to inverting 1-input 511. An output 551 of inverter 550 connects to one end of transistors N1 and P1, while output 520 of mux 500 connects to the other end of transistors N1 and P1. Likewise, a signal connected to 0-input terminal 510 is connected to one end of transistors N2 and P2, while output 520 connects to the other end of transistors N2 and P2. When a binary low signal is placed on select control 530, mux 500 is configured to place a binary signal on output 520 that is equivalent to a signal placed on 0-input 510. Likewise, when a binary high signal is placed on select control 530, mux 500 is configured to place a binary signal on output 520 equivalent to an inversion of a signal placed on inverting 1-input 511, as illustrated by FIG. 5B.

FIGS. 6A–6C illustrate mux 600 which is representative of the muxes in FIG. 4 having two non-inverting inputs. The operation of mux 600 is identical to the operation of mux 500, except for the inversion of one input on mux 500. FIG. 6A shows 0-input 610 and 1-input 611, select input 630 and output 620. FIG. 6B shows the truth table describing the operation of mux 600. FIG. 6C illustrates an implementation of mux 600 using four transistors N1, N2, P1 and P2 and inverter 640.

Returning to FIG. 4, a mux M1 has an inverted 1-input connected to input terminal 412, a 0-input connected to input terminal 413, a select control connected to input terminal 411, and produces output 441.

A mux M2 has a 0-input connected to output 441 of mux M1, a 1-input connected to output 447 of mux M7, a select control connected to control input terminal 421, and produces an output 442.

A mux M3 has a 0-input connected to output 441 of a fourth mux M4, a 1-input connected to input terminal 416, a select control connected to the output 441 of the mux M1, and produces an output 443.

A mux M4 has a 0-input connected to a input terminal 417, a 1-input connected to output 446 of a sixth mux M6, a select control connected to a second control input terminal 422, and produces an output 444.

A fifth mux M5 has a 0-input connected to an input terminal 415, an inverting 1-input connected to an input terminal 414, a select control connected to output 442 of mux M2, and produces an output 445.

A sixth mux M6 has a 0-input connected to input terminal 415, an inverting 1-input connected to input terminal 414, a select control connected to the output 443 of mux M3, and produces an output 446.

A seventh mux M7 has a 0-input connected to the output 445 of mux M5, a 1-input connected to the output 446 of mux M6, a select control connected to the output 449 of a ninth mux M9, and produces an output 449 connected to an output terminal 431.

An eighth mux M8 has a 0-input connected to the output 443 of mux M3, a 1-input connected to the output 445 of mux M5, a select control connected to an input terminal 418, and produces an output 448 connected to the second output terminal 432.

The ninth mux M9 has a 0-input connected to input terminal 418, an inverting 1-input connected to the output 441 of mux M1, a select control connected to control input terminal 421, and produces an output 449.

Control input terminals 421 and 422 are distinguished from input terminals 411–418 in that they are used to reconfigure logic module 400 to perform one of the following four different logical functions: boolean combinational logic of various input terminals 411–418, full adder with carry out, D-latch with preset and clear inputs and either high or low clock enable, and a D-flipflop with preset and clear inputs, and either low to high or high to low clock triggering. These functions are explained in more detail in the following paragraphs. Typically, the signals applied to control inputs 421–422 will be fixed at either a logic 0 or a logic 1 when FPGA 100 is programmed and therefore may require only two antifuses, one to logic low, such as ground, and one to logic high, such as $V_{cc}$. However, this is not a requirement of the present invention. Inputs 421–422 can be treated identically to inputs 411–418. If control inputs 421–422 are treated as data inputs, then the logic function performed by module 400 could by dynamically reconfigured in response to the state of inputs 421–422.

Figure 7A:
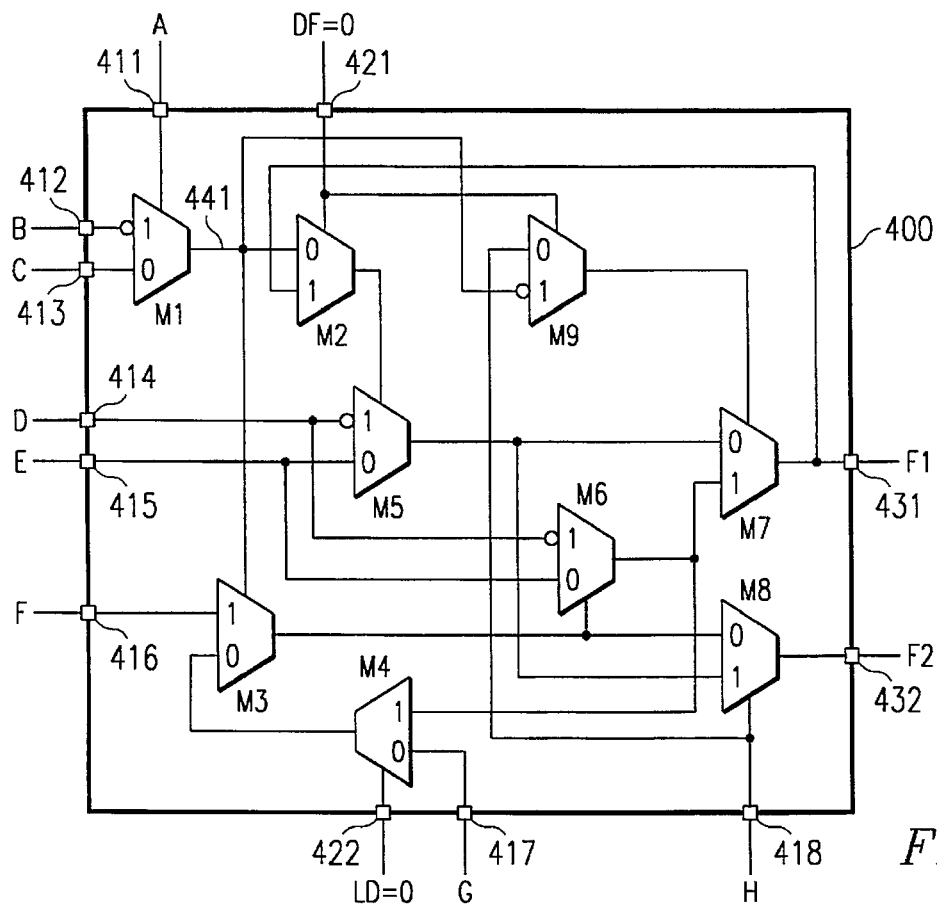
Figure 7B:
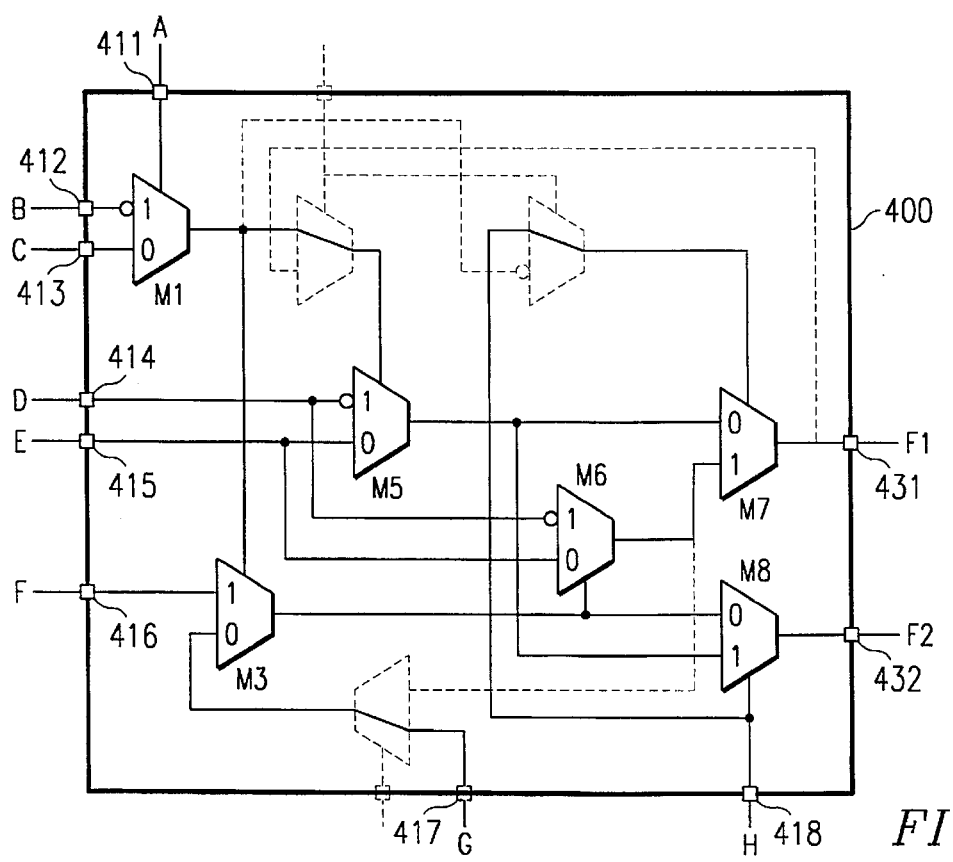

FIGS. 7A–7B illustrates logic module 400 configured as a pure combinational block. Control signals DF and LD are set to a logical 0 and placed on control inputs 421 and 422, respectively. This causes muxes M2, M4 and M9 to configure logic module 400 as shown in FIG. 7B. In FIG. 7B, muxes M2, M4 and M9 are not shown, even though in reality they are still present, so that the resultant configuration can be more clearly seen. Mux M2 passes signal 441 to the select input of M5. Mux M4 passes an input signal placed on input terminal 417 to the 0-input of M3. Mux M9 passes an input signal H placed on input 418 to the select input of mux M7. The signal propagation delay introduced by muxes M2, M4 and M9 may be minimized by suitable design techniques known to those skilled in the art, such as optimum selection of width/length ratios of the transistors comprising the muxes. Various input signals A–H can now be placed on input terminals 411–418 to produce various logical combinations of the input signals at outputs 431 and 432, as is well known by those skilled in the art.

As shown in Table 1 and according to the present invention, any one of over 1800 combinational functions of one to eight of the inputs 411–418 can be created advantageously on both outputs 431–432. The use of multiplexers for all of the logic elements within logic module 400 advantageously results in significantly more combinational functions than the prior art.

TABLE 1

| FUNCTIONS OF "N" VARIABLES | PRIOR ART | LOGIC MODULE 400 | |
|---|---|---|---|
| | | OUTPUT 431 | OUTPUT 432 |
| 1 | 2 | 2 | 2 |
| 2 | 8 | 8 | 8 |
| 3 | 48 | 65 | 65 |
| 4 | 238 | 590 | 694 |
| 5 | 319 | 838 | 1120 |
| 6 | 130 | 274 | 332 |
| 7 | 20 | 30 | 33 |
| 8 | 1 | 1 | 1 |
| Total | 766 | 1808 | 2255 |

FIG. 8a illustrates logic module 400 configured as a full adder circuit. Control signals DF and LD are set to a logical 0 and placed on control inputs 421 and 422, respectively. Input signal H is set to logical 0 and placed on input 418. Input signal A represents a first addend Y and is applied to input 411. A second addend X is applied to inputs 412, 413, and 417. A carry-in signal $C_i$ is applied to inputs 414–416. A sum signal S, of $X+Y+c_i$ is produced on output terminal 431, while a carry-out signal $C_o$, is produced on output 432.

In order to better understand the operation of the adder, FIG 8B illustrates a full adder 450 circuit drawn using XOR gates 452 and 453 and mux 451. If signals X and Y are both logical 1 or both logical 0, gate 453 will cause mux 451 to reproduce the binary state of signal Y, which is also the same state as signal X, as output signal $C_o$. This in accordance with the operation of an adder in which a carry-out is produced if both addends are 1. Likewise, a carry-out does not occur if both addends are 0. If only one addend X or Y is 1, mux 451 will reproduce the binary state of signal $C_i$ as output signal $C_o$. This is in accordance with the need to generate a carry-out $C_o$ equal to logical 1 if carry-in $C_i$ is logical 1 and one addend X or Y is logical 1. FIG. 8C illustrates the truth table for adder 450. FIG. 8D illustrates how mux 455 is logically equivalent to XOR gate 456.

Figure 8E:
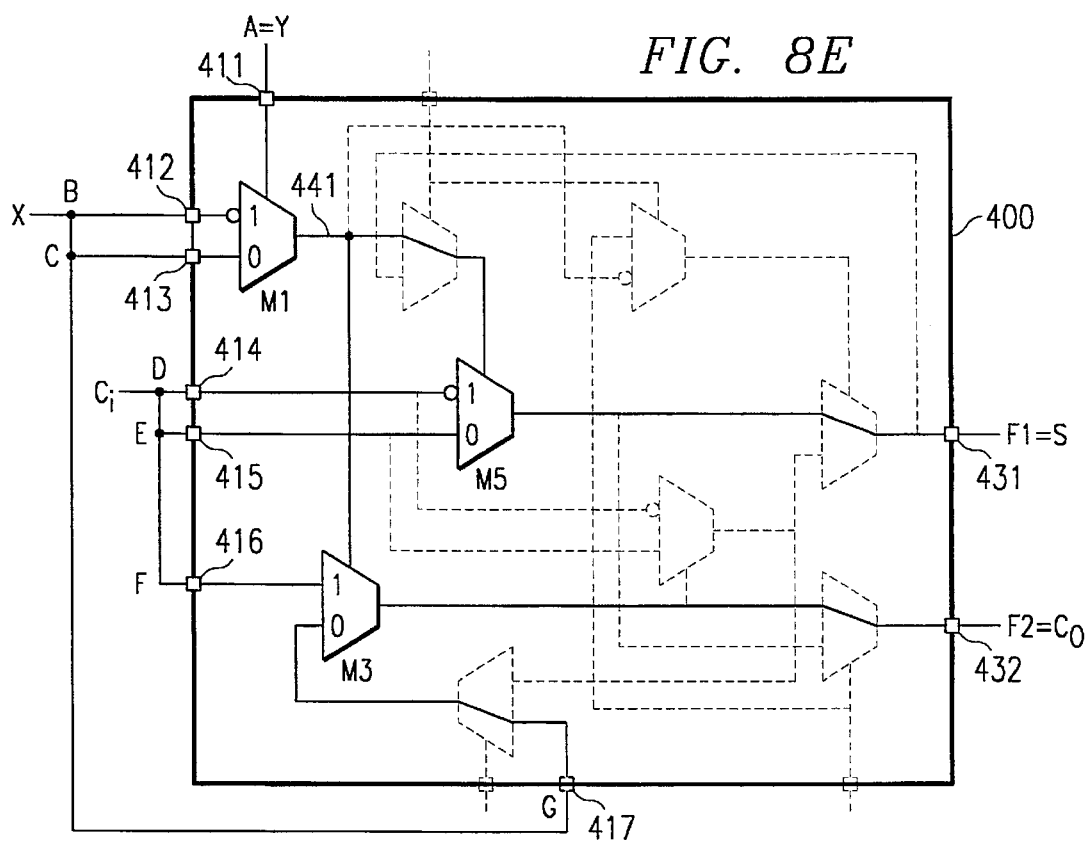

With this in mind, refer to FIG. 8E which illustrates the resultant circuit of logic module 400 configured as an adder circuit with muxes M2, M4, and M6–M9 not shown for clarity. Mux M1 is equivalent to gate 453, mux M5 is equivalent to gate 452 and mux M5 is equivalent to mux 451. Therefore, logic module 400 configured as a full adder provides a sum signal S on output 431 and a carry out signal $C_o$ on output 432 in accordance with the truth table shown in FIG. 8C.

Figure 9A:
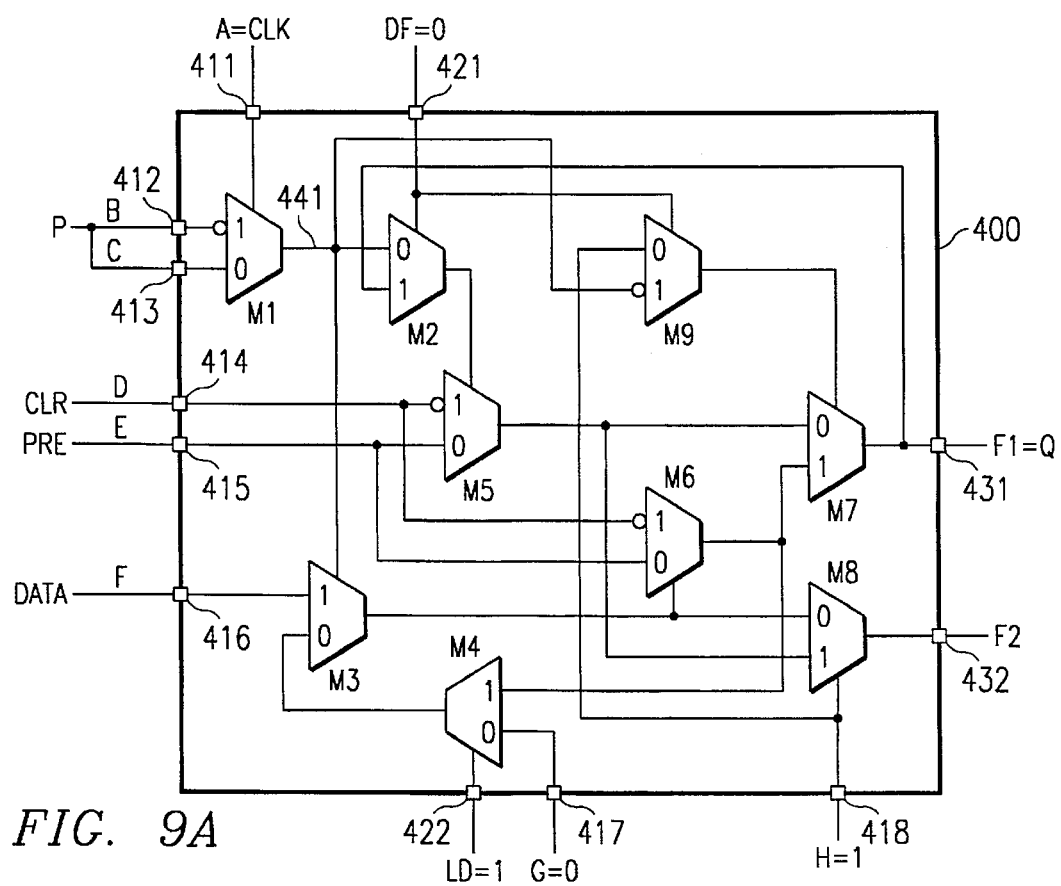
FIGS. 9A–9C illustrate the logic module of FIG. 4 configured as a D-latch circuit.

FIG. 9a illustrates logic module 400 configured as a D-latch circuit. Control signal DF is set to logic 0 and applied to input terminal 421. Control signal LD is set to logic 1 and applied to input 422. Input signal G is set to logic 0 and applied to input terminal 417. Input signal H is set to logic 1 and applied to input terminal 418. This selection of input signals G, H, DF and LD cause muxes M2, M4–M5, and M7–M9 to configure module 400 as a D-latch. FIG. 9C illustrates logic module 400 with muxes M2, M4–M5, and M7–M9 not shown, even though in reality they are still present, so that the resultant configuration can be more clearly seen.

Figure 9B:
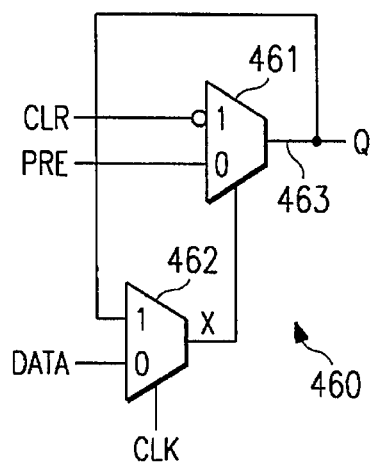
Figure 9C:
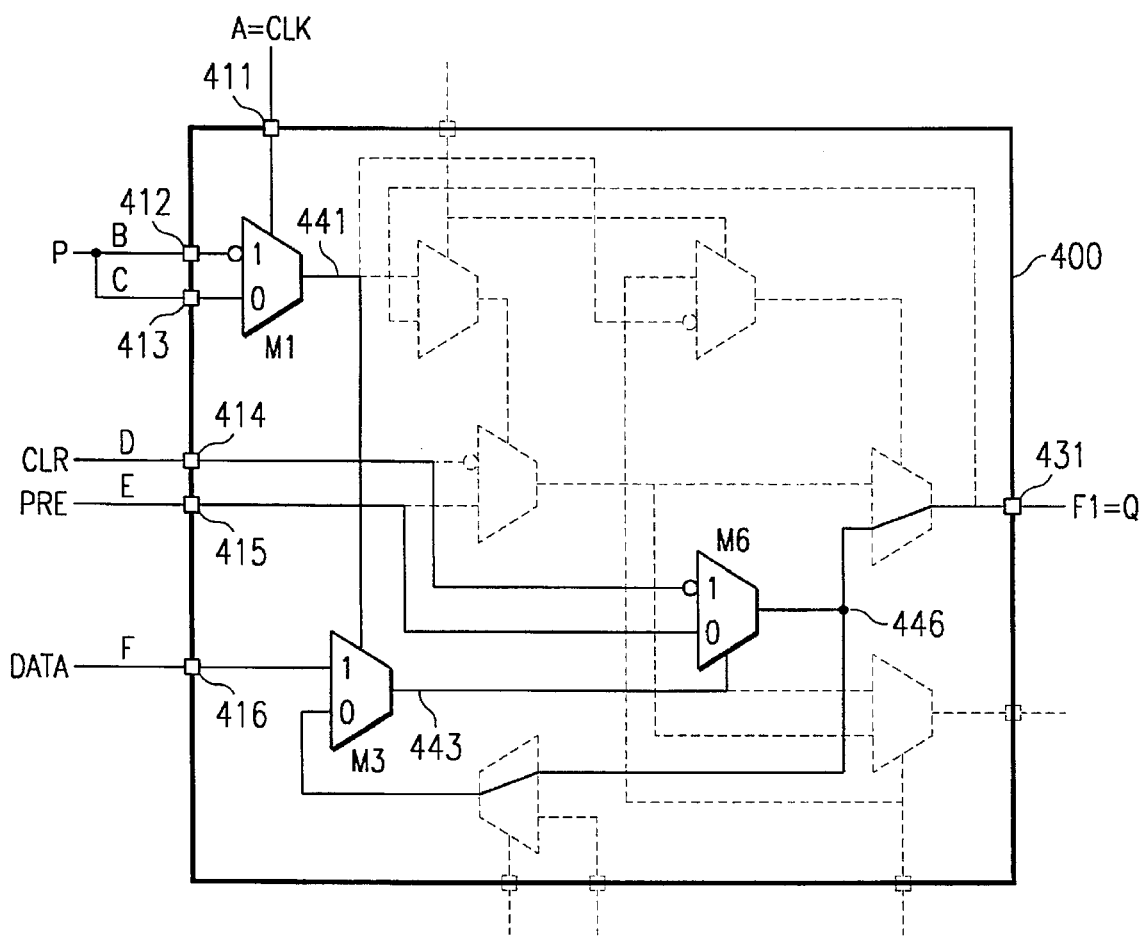

To better understand the operation of the D-latch, refer now to FIG. 9B which illustrates a simple D-latch 460 comprised of a mux 461 and a mux 462. A signal 463 provides a feedback path which feeds the output of mux 461 back to the 1-input of mux 462. When a clock signal CLK is low, a data signal DATA is enabled to pass through mux 462 and is represented on signal X which is connected to the select input of mux 461. Output signal 463, which is also referred to as signal Q, of mux 461 can be represented in boolean notation as:

Q=((PRE) AND (!X)) OR ((!CLR) AND (X))

where the notation "!" means "inverted" or "negated"

Thus, when signal PRE and CLR are both logical 0, then output signal Q=signal X. When the clock signal CLK goes high, feedback signal 463 is selected from the 1-input of mux 462 and the state of signal DATA is latched in D-latch 460.

If preset signal PRE is set to a logic 1, output signal Q and feedback signal 463 will also become logic 1 and D-latch 460 will become "set" to logic state 1. Likewise, if clear signal CLR is set to logic 1, output signal Q and feedback signal 463 will become logic 0 and D-latch 460 will become "cleared" to logic state 0.

The D-latch circuit that is configured in module 400 and illustrated in FIG. 9C operates similarly to latch 460 of FIG. 9B. A data signal DATA is applied to input terminal 416. A clock signal CLK is applied to input terminal 411. A preset signal PRE is applied to terminal 415 and a clear signal CLR is applied to terminal 414. Mux M3 passes the state of signal DATA to mux M6 when output 441 of mux M1 is a logic 1. Mux M6 reproduces the state of signal DATA on output 446 if signals CLR and PRE are both logic 0. Mux M4 provides a feedback path for signal 446 back to the 0-input of mux M3. Hence, when signal 441 goes to logic 0, the state of signal DATA is latched in the D-latched formed in logic module 400 and output terminal 431 provides a signal Q which represents the latched state of signal DATA.

Referring again to FIG. 9C, the D-latch of module 400 is advantageously enabled when clock signal CLK is either high or low. This feature is implemented by mux M1 which has a polarity select signal P connected to the inverting 1-input and the 0-input via input terminals 412–413 and clock signal CLK connected to the select input via terminal 411. Mux M1 functions now as an exclusive-OR gate. When signal P is set to logic 0, the D-latch of module 400 operates as an active high D-latch. That is, input signal DATA is passed through to output signal Q when clock signal CLK is a logic 1. Likewise, when signal P is set to logic 1, the D-latch of module 400 operates as an active low D-latch, wherein the signal DATA is passed through to output Q when signal CLK is low.

Figure 10B:
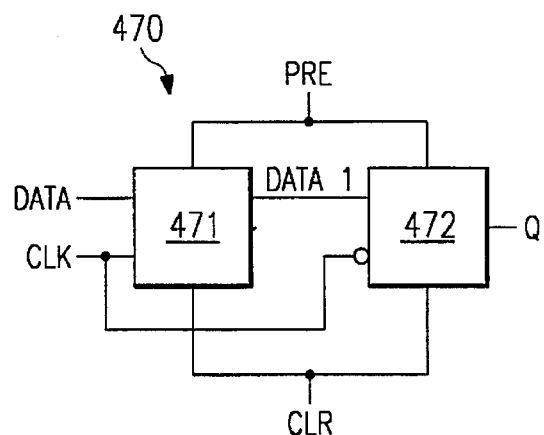
FIGS. 10A–10C illustrate the logic module of FIG. 4 configured as a D-flipflop circuit.
Figure 10A:
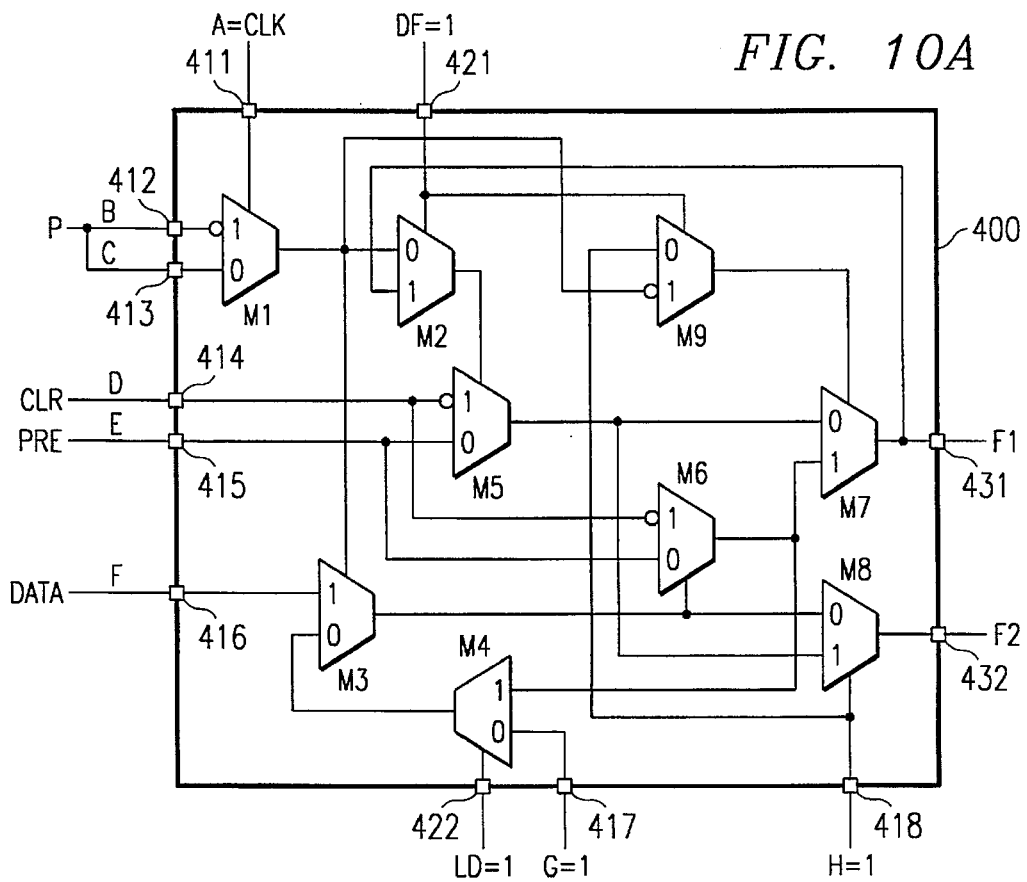
Figure 10C:
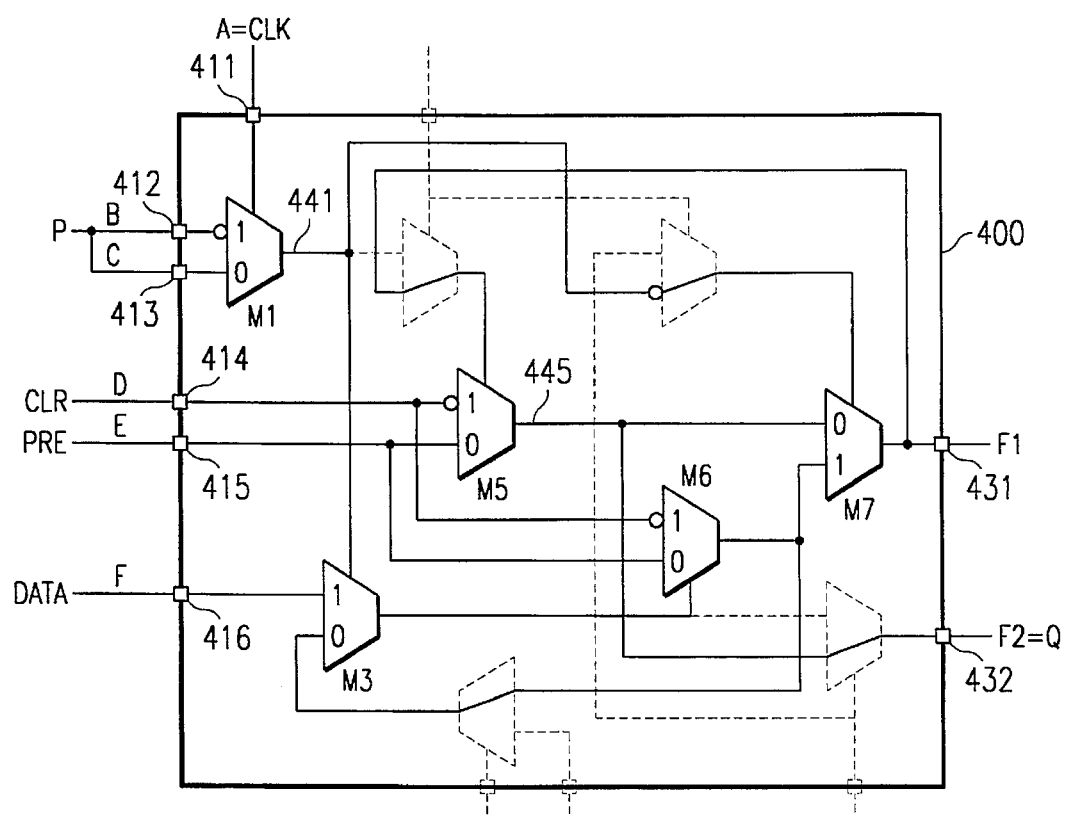

FIG. 10a illustrates logic module 400 configured as a D-flipflop circuit. Control signal DF is set to logic 1 and applied to input terminal 421. Control signal LD is set to logic 1 and applied to input 422. Input signal G is set to logic 1 and applied to input terminal 417. Input signal H is set to logic 1 and applied to input terminal 418. This selection of input signals G, H, DF and LD cause muxes M2, M4, and M8–M9 to configure module 400 as a D-flipflop. FIG. 10C illustrates logic module 400 with muxes M2, M4, and M8–M9 not shown, even though in reality they are still present, so that the resultant configuration can be more clearly seen.

To better understand the operation of the D-flipflop, refer now to FIG. 10B which illustrates a D-flipflop 470 comprised of D-latches 471 and 472. A clock signal CLK is connected to active high D-latch 471. A data signal DATA is connected to latch 471 and appears at output DATA1 when signal CLK is high. Signal CLK is also connected to active low D-latch 472. Therefore, when signal CLK transitions from high to low, the binary state of signal DATA is latched in latch 471 and latch 472 now transfers the state of latched signal DATA1 to output Q. This sequence is referred to as "triggering" the flipflop. Preset signal PRE sets the state of flipflop 470, as indicated by output Q, to logic 1, while clear signal CLR clears the state of flipflop 470 to logic 0.

The D-flipflop circuit that is configured in module 400 and illustrated in FIG. 10C operates similarly to flipflop 470 of FIG 10B. A data signal DATA is applied to input terminal 416. A clock signal CLK is applied to input terminal 411. A preset signal PRE is applied to terminal 415 and a clear signal CLR is applied to terminal 414. Muxes M3 and M9 with mux M4 providing feedback operate as a D-latch, as described earlier, and function as a first D-latch similar to latch 471. Muxes M5 and M7 function as a second D-latch similar to latch 472. Clock signal CLK passes through mux M1 and signal 441 is applied to mux M3. Signal 441 is inverted by mux M9 and applied to mux M7 as an inverted clock signal. Signal 445 is output via output terminal 432 as signal Q, which represents the state of the D-flipflop of module 400.

Referring again to FIG. 10C, the D-flipflop of module 400 is advantageously triggered when clock signal CLK transitions from either high to low, referred to as "negative edge triggering" or "falling edge triggering," or low to high, referred to as "positive edge triggering" or "rising edge triggering." This feature is implemented by mux M1 which has a polarity select signal P connected to the inverting 1-input and the 0-input via input terminals 412–413 and clock signal CLK connected to the select input via terminal 411. Mux M1 functions now as an exclusive-OR gate. When signal P is set to logic 0, the D-flipflop of module 400 operates as a negative edge triggered flipflop. That is, input signal DATA is passed through to output signal Q when clock signal CLK transitions from a high to a low. Likewise, when signal P is set to logic 1, the D-flipflop of module 400 operates as positive edge triggered flipflop, wherein the signal DATA is passed through to output Q when signal CLK transitions from low to high.

Figure 11:
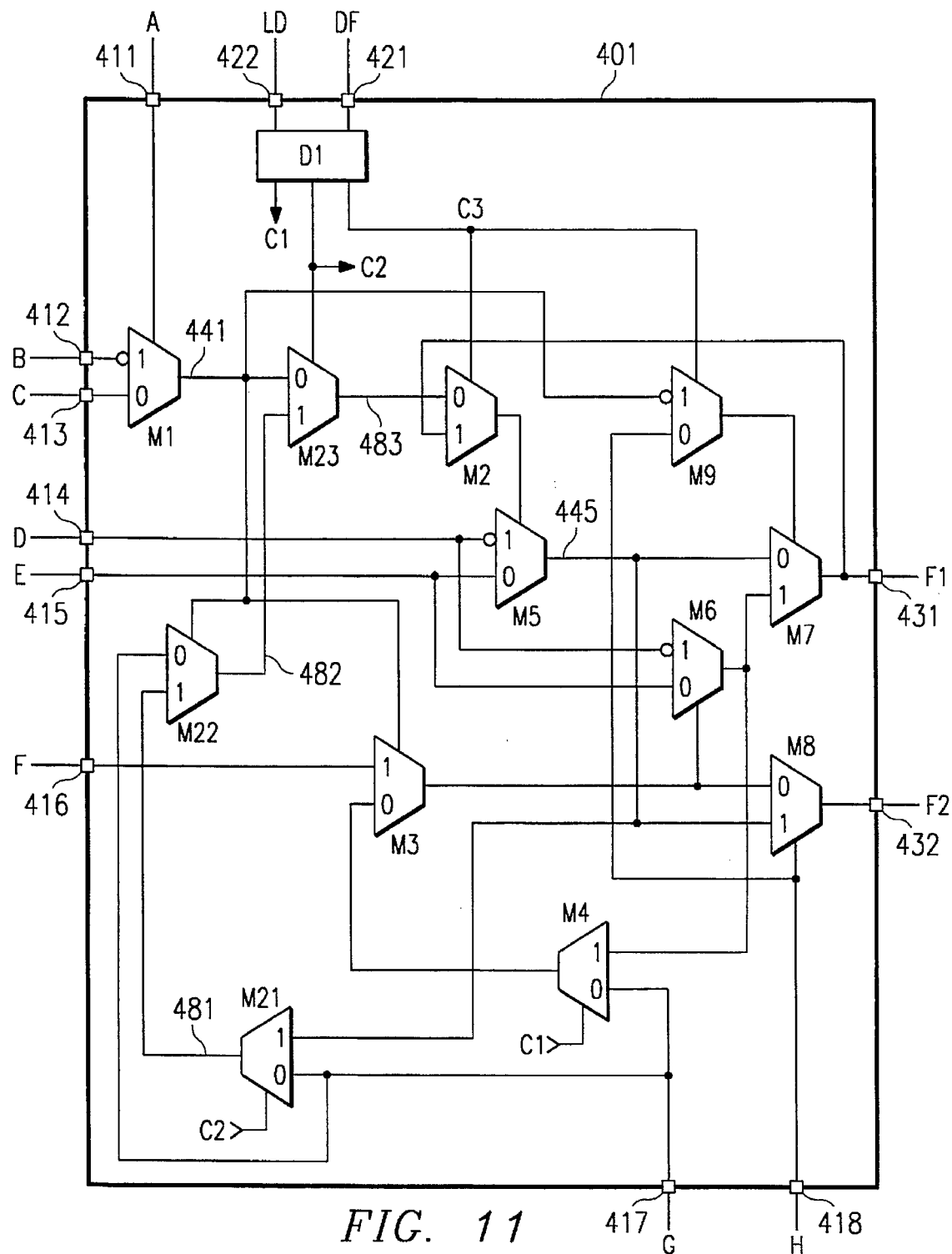
FIG. 11 illustrates an alternate embodiment of a logic module having decoded control states formed according to the present invention.

FIG. 11 illustrates an alternative embodiment of the present invention in which a decoder D1 converts the two control signals LD and DF into four states. Decoder D1 has three outputs, control signals C1, C2 and C3. If needed, more than three control signals could be produced by decoder D1. Each control state is represented by a distinct binary pattern placed on control signals C1–C3. TABLE 2 illustrates the control signal patterns used in FIG. 11. By using decoder D1 to generate more control signals, more reconfiguration flexibility is possible, while advantageously requiring only two input terminals 421–422.

FIG. 11 shows a logic module 401 which is an enhancement of module 400 accomplished by the addition of muxes M20–M22. Mux M21 has a 0-input connected to the input terminal 417, a 1-input connected to the output 445 of mux M5, a select control connected to control signal C2, and produces an output 481.

Mux M22 has a 0-input connected to input terminal 417, a 1-input connected to output 481 of mux M21, a select control connected to output 441 of mux M1, and produces an output 482.

Mux M23 has a 0-input connected to output 441 of the first mux M1, a 1-input connected to output 482 of mux M22, a select control connected to control signal C2, and produces an output 483.

On mux M2, the 0-input connection is replaced by a connection to output 483 of mux M23, and the select control connection is replaced by a connection to control signal C3.

On mux M4, the select control connection is replaced by a connection to control signal C1.

On mux M9, the select control connection is replaced by a connection to control signal C3.

Still referring to FIG. 11, logic module 401 provides all of the functions provided by logic module 400 in a similar manner. In addition, module 401 advantageously may be configured to provide two D-latches. A first D-latch has a data input signal DATA1 applied to input terminal 416 and produces an output signal Q1 on output terminal 431. A second D-latch has a data input signal DATA2 applied to input terminal 417 and produces an output signal Q2 on output terminal 432. Module 401 is reconfigured to provide any one of the following functions in response to control input signals LD and DF as shown in TABLE 2: pure combinational logic, as shown in TABLE 1; full adder; single D-latch; two D-latches; and D-flipflop.

TABLE 2

| C1 | C2 | C3 | CONFIGURATION | Mux PATH | FEED BACK MUX |
|---|---|---|---|---|---|
| 0 | 0 | 0 | Combinational: H = 0 or 1 Adder: H = 0 | | |
| 0 | 0 | 0 | Single D-latch: H = 1, A = CLK, B = C = P, D = CLR, E = PRE, F = DATA, F1 = Q | M1-M3-M6-M7 | M4 |
| 1 | 0 | 1 | Single D-flipflop: H = 1, A = CLK, B = C = P, D = CLR, E = PRE, F = DATA, F2 = Q | M1-M3-M6-M7-M2-M5-M8 | M4 |
| 1 | 1 | 0 | Two D-latches: H = 1, A = CLK, B = C = P, D = CLR, E = PRE, F = DATA1, F1 = Q1; A = CLK, B = C = P, D = CLR, E = PRE, G = DATA2, F2 = Q2 | M1-M3-M6-M7, M1-M22-M23-M2-M5-M8 | M4, M3 |

Figure 12:
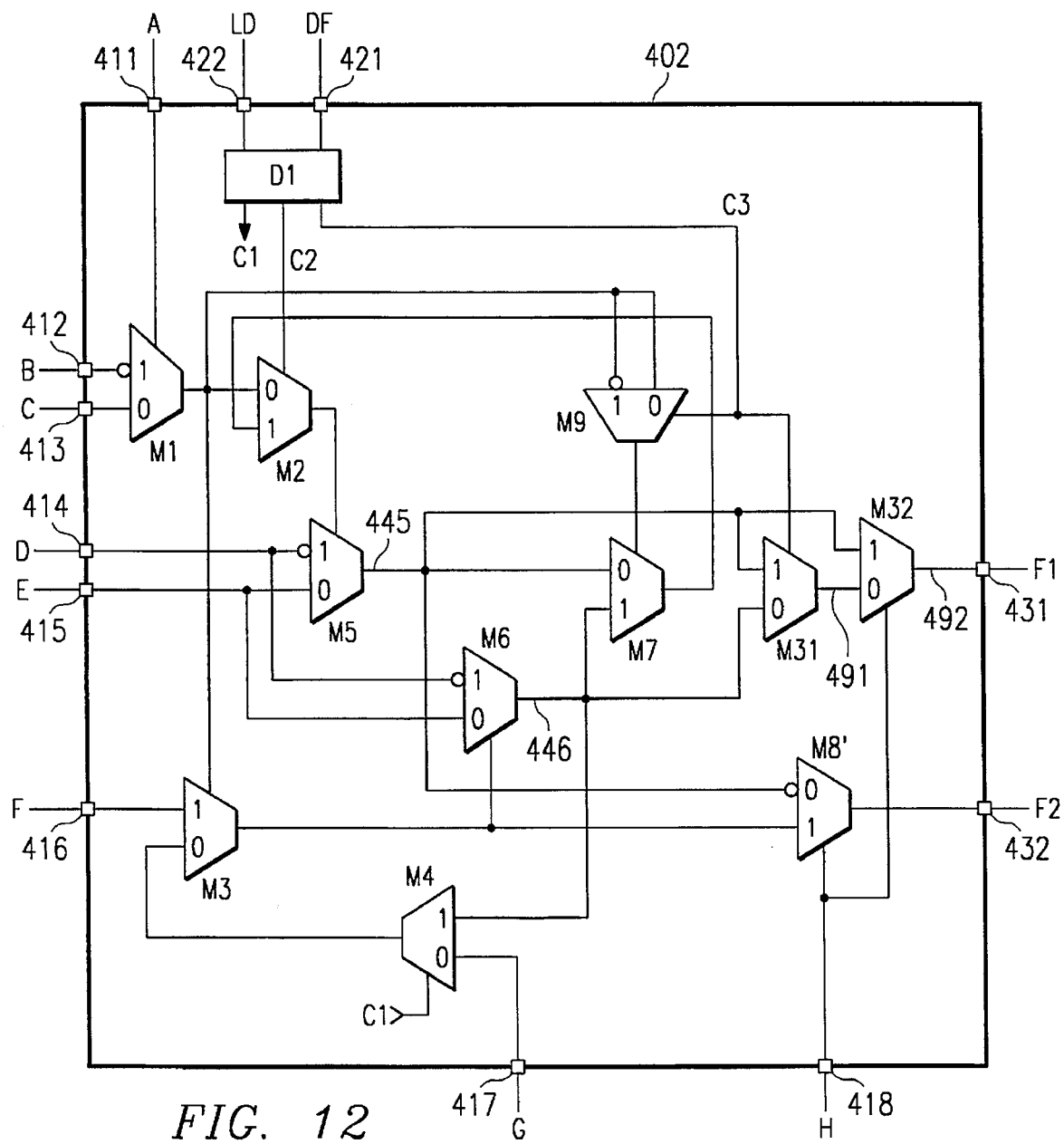
FIG. 12 illustrates another alternate embodiment of a logic module having decoded control states formed according to the present invention.

FIG. 12 illustrates an alternate embodiment logic module 402 which has decoded control states and is formed according to the present invention. Mux M31 has a 0-input connected to output 446 of mux M6, a 1-input connected to output 445 of mux M5, a select control connected to a control signal C3 from decoder D1, and produces an output 491.

Mux M32 has a 0-input connected to output 491 of mux M31, a 1-input connected to output 445 of mux M5, a select control connected to input terminal 418, and produces an output 492.

The connection to output terminal 431 is replaced by a connection to output 492 of mux M32.

On mux M2, the select control connection is replaced by a connection to control signal C2 from the decoder.

On mux M4, the select control connection is replaced by a connection to control signal C1 from the decoder.

On mux M8, the 0-input is an inverting input.

On mux M9, the select control connection is replaced by a connection the control signal C3 from the decoder.

Still referring to FIG. 12, logic module 402 provides all of the functions provided by logic module 400 in a similar manner. In addition, module 402 advantageously may be configured to provide two D-latches connected in series. A first D-latch has a data input signal DATA applied to input terminal 416 and produces an output signal 446 on mux M6. A second D-latch has signal 446 applied to the 1-input of mux M7 and produces an output signal Q on output terminal 431. Additionally, an inverted output signal !Q is placed on output terminal 432.

Still referring to FIG. 12, when module 402 is configured as a D-flipflop, both a Q and a !Q signals are produced on output terminals 431 and 432 respectively.

Still referring to FIG. 12, when module 402 is configured as a D-flipflop or as one or two D-latches, preset and clear functions are provided by setting input signal PRE to logic 1 on input terminal 415 or input signal CLR to logic 1 on input terminal 414, respectively.

Module 402 can be reconfigured to provide any one of the following functions in response to control input signals LD and DF as shown in TABLE 3: pure combinational logic, as shown in TABLE 4; full adder; single D-latch; two sequential D-latches with Q and !Q outputs; and a D-flipflop with Q and !Q outputs.

TABLE 3

| C1 | C2 | C3 | CONFIGURATION | Mux PATH | Feed Back Mux |
|---|---|---|---|---|---|
| 0 | 0 | 0 | Combinational: H = 0 or 1; Adder: H = 0 | | |
| 1 | 0 | 0 | Single D-latch: H = 0, A = CLK, B = C = P, D = CLR, E = PRE, F = DATA, F1 = Q | M1-M3-M6-M31-M32 | M4 |
| 1 | 1 | 1 | Single D-flipflop: H = 0, A = CLK, B = C = P, D = CLR, E = PRE, F = DATA, F1 = Q, F2 = !Q | M1-M3-M6-M7-M2-M5-M31-M32, M1-M3-M6-M7-M2-M5-M8 | M4 |
| 1 | 1 | 0 | Two sequential D-latches: H = 1, A = CLK, B = C = P, D = CLR, E = PRE, F = DATA, F1 = Q, F2 = !Q | M1-M3-M6-M7-M2-M5-M32 | M4 |

TABLE 4

| Functions of 'N' Variables | Logic Module 400 and 401 | | | Logic Module 402 | |
|---|---|---|---|---|---|
| | Prior Art | F1 | F2 | F1 | F2 |
| 1 | 2 | 2 | 2 | 2 | 2 |
| 2 | 8 | 8 | 8 | 8 | 8 |
| 3 | 48 | 65 | 65 | 65 | 64 |
| 4 | 238 | 590 | 694 | 588 | 730 |
| 5 | 319 | 838 | 1120 | 831 | 1143 |
| 6 | 130 | 274 | 332 | 274 | 333 |
| 7 | 20 | 30 | 33 | 30 | 33 |
| 8 | 1 | 1 | 1 | 1 | 1 |
| Total | 766 | 1808 | 2255 | 1799 | 2314 |

A brief summary of the functionality of logic modules 400,401 and 402 presented in TABLE 5. Any one of these modules may be used in FPGA 100 either individually or in combination. In addition, they may be mixed with other types of logic modules.

TABLE 5

| | Boolean on Output 431 | Boolean on Output 432 | Sequential circuits (All with Preset and Clear) | Adder Circuit |
|---|---|---|---|---|
| Logic Module 400 | 1808 | 2255 | D-flipflop: Positive or Negative edge triggered; Single D-latch: Active-low/Active-high | Full Adder |

TABLE 5-continued

| | Boolean on Output 431 | Boolean on Output 432 | Sequential circuits (All with Preset and Clear) | Adder Circuit |
|---|---|---|---|---|
| Logic Module 401 | 1808 | 2255 | Single D-latch: Active-low or Active-high; Two D-latches: Active-low or Active-high; D flipflop: Positive or Negative edge triggered | Full Adder |
| Logic Module 402 | 1709 | 2314 | D-latch: Active-low or active-high; D-latch with Q and !Q: Active- or active-high; D-flip-flop with Q and !Q: Positive or Negative edge triggered | Full Adder |

When configured as a combinational function generator, a rich set of combinational functions is advantageously available at both outputs of logic modules 400–402. The availability of the full adder circuit in each of the modules 400–402 helps in building adders, subtractors and multipliers easily. Modules 400–402 are well suited for digital signal processing applications.

An advantage of modules 400–402 is that by reconfiguring the logic elements to perform both combinational and sequential functions, the size of the module is minimized.

Shift registers may be efficiently formed using a plurality of modules 400–402 configured as D-latches or D-flipflops. The availability of both Q and !Q outputs in the same logic module 402 helps to build structures such as counters efficiently.

Decoder D1 within logic module 401–402 advantageously permits added control flexibility while maintaining a small number of control inputs.

Preset and clear functions on the D-latches and D-flipflops of modules 400–402 are advantageous in many uses of the modules.

Another advantage of modules 400–402 is the flexibility of configuring the D-latches to have high or low enable clock inputs and the D-flipflop to have positive or negative triggering. Thus, the need for inversions of clock signals is minimized.

Another advantage of modules 400–402 is the designation of inputs LD and DF as control inputs. By limiting their use to a fixed high or low after programming, only two antifuses are needed for each of inputs LD and DF.

As used herein, the terms "applied" "connected" and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A logic module for use in a field programmable gate array integrated circuit comprising:

a plurality of input terminals, two output terminals, a plurality of logic elements, and an interconnection network interconnecting said input terminals, logic elements and output terminals;

said interconnection network and said logic elements being responsive to a first combination of signals on at least some of said input terminals to form a boolean combination circuit;

said interconnection network and said logic elements being responsive to a second combination of signals on at least some of said input terminals to form a full adder circuit;

said interconnection network and said logic elements being responsive to a third combination of signals on at least some of said input terminals to form a D-latch circuit that has a preset input and a clear input; and said interconnection network and said logic elements being responsive to a fourth combination of signals on at least some of said input terminals to form a D-flipflop circuit that has a preset input and a clear input.

2. The logic module for use in a field programmable gate array integrated circuit of claim 1, wherein:

said third combination of signals forms two D-latch circuits, each D-latch having an output connected to a respective one of said output terminals.

3. The logic module for use in a field programmable gate array integrated circuit of claim 1, wherein said D-latch further comprises:

means to sequentially latch an inverted and a non-inverted representation of a data signal at a certain one of said input terminals in response to a logic level of a clock signal at another one of said input terminals.

4. The logic module for use in a field programmable gate array integrated circuit of claim 1, wherein said D-flipflop further comprises:

means to sequentially latch an inverted and a non-inverted representation of a data signal at a certain one of said input terminals in response to a logic transition of a clock signal at another one of said input terminals.

5. The logic module for use in a field programmable gate array integrated circuit of claim 1, wherein:

each logic element comprises a multiplexer having a first and a second input, a select control and an output.

6. The logic module for use in a field programmable gate array integrated circuit of claim 1, wherein:

a plurality of externally generated input signals is received by said input terminals.

7. The logic module for use in a field programmable gate array integrated circuit of claim 1, wherein:

a plurality of said logic modules are interconnected with a second interconnection network for selectively interconnecting said logic modules.

8. A method for forming a logic module for use in a field programmable gate array integrated circuit comprising the steps of:

forming a logic module having a plurality of input terminals, a plurality of logic elements, and two output terminals;

interconnecting said logic elements within said logic module to said input terminals and said output terminals;

forming control circuitry within said logic module to selectively reconfigure said logic elements to form any one circuit selected from the group of circuits comprising a boolean combinational function generator, a full adder, a D-latch having a preset input and a clear input, or a D-flipflop having a preset input and a clear input connected to certain ones of said input terminals; wherein the step of forming control circuitry within said logic module further comprises:

decoding a certain plurality of said input terminals of said logic module into a larger plurality of control states represented by a plurality of control signals; and using said control signals to reconfigure the logic elements within said logic module to form a logic circuit in accordance with said control state; and placing the output of said logic circuit on said output terminals.

9. The method for forming a logic module for use in a field programmable gate array integrated circuit of claim 8, wherein the step of placing the results on said outputs comprises:

placing a Q signal of said D-flipflop on one of said output terminals and a !Q signal of said D-flipflop on the other of said output terminals;

placing a Q signal of said D-latch on one of said output terminals and a !Q signal of said D-latch on the other of said output terminals;

placing a sum signal of said adder on one of said output terminals and a carry-out signal of said adder on the other of said output terminals; or placing a first combinational result signal of said combinational function generator on one of said output terminals and a second combinational result signal of said combinational function generator on the other of said output terminals.

10. The method for forming a logic module for use in a field programmable gate array integrated circuit of claim 8, wherein the step of placing the results on said output terminals comprises:

placing a first latched signal representative of a first D-latch on one of said output terminals; and placing a second latched signal representative of a second D-latch on the other of said output terminals.

11. The method for forming a logic module for use in a field programmable gate array integrated circuit of claim 8, wherein the step of placing the results on said output terminals comprises:

placing a Q signal of said D-latch on one of said output terminals.

12. The method for forming a logic module for use in a field programmable gate array integrated circuit of claim 8, wherein the step of reconfiguring said logic elements to perform boolean combinational functions comprises:

performing approximately at least 1,800 logical combinations of said plurality of input terminals;

the step of placing the results on said output terminals comprises:

placing a first combinational result which is one of approximately 1,800 logical combinations of said plurality of input terminals on one of said output terminals; and placing a second combinational result which is one of approximately 1,800 logical combination of said plurality of input terminals on the other of said output terminals.

13. The method for forming a logic module for use in a field programmable gate array integrated circuit of claim 8, wherein the step of reconfiguring the logic elements to perform said D-latch comprises:

enabling said D-latch on either a low level of a clock signal or a high level of said clock signal responsive to a signal on one of said input terminals.

14. The method for forming a logic module for use in a field programmable gate array integrated circuit of claim 8, wherein the step of reconfiguring said logic elements to perform said D-flipflop comprises:

triggering said D-flipflop on a high to low clock transition of a clock signal or a low to high clock transition of said clock signal responsive to a signal on another one of said input terminals.

15. The method for forming a logic module for use in a field programmable gate array integrated circuit of claim 8, wherein the step of forming said logic module further comprises:

forming a plurality of logic modules; and providing a means to selectively interconnect said output terminals of each said logic module to said input terminals of at least a plurality of other said logic modules.

16. A logic module for use in a field programmable gate array integrated circuit, comprising:

a logic module having a plurality of input terminals, two output terminals, a plurality of logic elements, and an interconnection network interconnecting said input terminals, logic elements and output terminals;

said logic module further comprising:

a first mux having an inverting 1-input connected to one of said input terminals, a 0-input connected to a second one of said input terminals, a select control connected to a third one of said input terminals, and an output;

a second mux having a 0-input connected to said output of said first mux, a 1-input connected to an output of a seventh mux, a select control connected to a first one of certain said input terminals designated as control input terminals, and an output;

a third mux having a 0-input connected to an output of a fourth mux, a 1-input connected to a sixth one of said input terminals, a select control connected to said output of said first mux, and an output;

said fourth mux having a 0-input connected to a seventh one of said input terminals, a 1-input connected to an output of a sixth mux, a select control connected to a second one of certain said input terminals designated as control input terminals, and an output;

a fifth mux having a 0-input connected to a fifth one of said input terminals, an inverting 1-input connected to a fourth one of said input terminals, a select control connected to said output of said second mux, and an output;

said sixth mux having a 0-input connected to said fifth one of said input terminals, an inverting 1-input connected to said fourth one of said input terminals, a select control connected to said output of said third mux, and an output;

said seventh mux having a 0-input connected to said output of said fifth mux, a 1-input connected to said output of said sixth mux, a select control connected to an output of a ninth mux, and an output connected to one of said output terminals;

an eighth mux having a 0-input connected to said output of said third mux, a 1-input connected to said output of said fifth mux, a select control connected to an eighth one of said input terminals, and an output connected to a second one of said output terminals; and said ninth mux having a 0-input connected to said eighth one of said input terminals, an inverting 1-input connected to said output of said first mux, a select control connected to said first control terminal, and an output.

17. The logic module for use in a field programmable gate array circuit of claim 16, further comprising:

a decoder having two inputs connected to two of said input terminals designated as control input terminals, and having a plurality of control signal outputs;

a tenth mux having a 0-input connected to said seventh one of said input terminals, a 1-input connected to said output of said fifth mux, a select control connected to a second one of said control outputs of said decoder, and an output;

an eleventh mux having a 0-input connected to said seventh one of said input terminals, a 1-input connected to said output of said tenth mux, a select control connected to said output of said first mux, and an output;

a twelfth mux having a 0-input connected to said output of said first mux, a 1-input connected to said output of said eleventh mux, a select control connected to said second output of said decoder, and an output;

on said second mux, said 0-input connection is replaced by a connection to said output of said twelfth mux, and said select control connection is replaced by a connection to a third one of said outputs of said decoder;

on said fourth mux, said select control connection is replaced by a connection to a first one of said outputs of said decoder; and on said ninth mux, said select control connection is replaced by a connection to said third output of said decoder.

18. The logic module for use in a field programmable gate array integrated circuit of claim 16, further comprising:

a decoder having two inputs connected to two of said input terminals designated as control input terminals, and having a plurality of control signal outputs;

a tenth mux having a 0-input connected to said output of said sixth mux, a 1-input connected to said output of said fifth mux, a select control connected to a third one of said outputs of said decoder, and an output;

an eleventh mux having a 0-input connected to said output of said tenth mux, a 1-input connected to said output of said fifth mux, a select control connected to eight one of said input terminals, and an output;

said connection to said first one of said output terminals is replaced by a connection to said output of said eleventh mux;

on said second mux, said select control connection is replaced by a connection to a second one of said outputs of said decoder;

on said fourth mux, said select control connection is replaced by a connection to a first one of said outputs of said decoder;

on said eighth mux, said 0-input is an inverting input; and on said ninth mux, said select control connection is replaced by a connection to said third output of said decoder.

19. A logic module for use in a field programmable gate array integrated circuit comprising:

a plurality of input terminals, two output terminals, a plurality of logic elements, and an interconnection network interconnecting said input terminals, logic elements and output terminals, the logic elements being configurable to form preselected types of sequential and combinational logic functions in response to a plurality of control states; and a decoder having a plurality of inputs connected to certain of said input terminals, wherein the decoder decodes said plurality of control states in response to signals placed on the decoder inputs such that the number of control states is greater than the number of decoder inputs.

* * * * *